(12) United States Patent
Kawasumi (10) Patent No.: US 11,615,834 B2
(45) Date of Patent: Mar. 28, 2023

(54) SEMICONDUCTOR STORAGE DEVICE AND INFORMATION PROCESSOR

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 8 days.

(21) Appl. No.: 17/197,371

(22) Filed: Mar. 10, 2021

(65) Prior Publication Data

US 2022/0084581 A1 Mar. 17, 2022

(30) Foreign Application Priority Data

Sep. 17, 2020 (JP) .............................. JP2020-156657

(51) Int. Cl.
| | | |
|---|---|---|
| G11C 11/4094 | (2006.01) | |
| G11C 11/4097 | (2006.01) | |
| G06N 3/063 | (2006.01) | |
| G06F 7/544 | (2006.01) | |
| G06N 3/08 | (2006.01) | |
| G11C 5/06 | (2006.01) | |

(52) U.S. Cl.
CPC ........ *G11C 11/4094* (2013.01); *G06F 7/5443* (2013.01); *G06N 3/063* (2013.01); *G06N 3/08* (2013.01); *G11C 5/06* (2013.01); *G11C 11/4097* (2013.01)

(58) Field of Classification Search
CPC ... G11C 11/4094; G11C 5/06; G11C 11/4097; G06F 7/5443; G06N 3/063; G06N 3/08
See application file for complete search history.

(56) References Cited

U.S. PATENT DOCUMENTS

| | | | |
|---|---|---|---|
| 10,332,594 B2 | 6/2019 | Miyashita | |
| 10,642,612 B2 | 5/2020 | Kim | |
| 11,127,460 B2* | 9/2021 | Asnaashari | G11C 8/14 |
| 2019/0088339 A1* | 3/2019 | Miyashita | G06N 3/063 |
| 2019/0146788 A1 | 5/2019 | Kim | |
| 2020/0034697 A1 | 1/2020 | Choi | |
| 2021/0271631 A1* | 9/2021 | Snelgrove | G06F 1/3243 |
| 2022/0028445 A1* | 1/2022 | Park | G11C 11/419 |

FOREIGN PATENT DOCUMENTS

| | | |
|---|---|---|
| JP | 2018-133016 A | 8/2018 |
| JP | 2019-057053 A | 4/2019 |

* cited by examiner

*Primary Examiner* — Ajay H Ojha
(74) *Attorney, Agent, or Firm* — Foley & Lardner LLP (57) ABSTRACT

A semiconductor storage device has a plurality of memory cells that are arranged in a first direction and store first data, a plurality of first wiring pairs that are provided corresponding to the plurality of memory cells arranged in the first direction, and supply second data multiplied with the first data, a second wiring pair that is provided corresponding to two memory cells adjacent to each other in the first direction, and outputs multiplication data obtained by multiplying the first data stored in the two memory cells with the corresponding second data on the first wiring pair, and a third wiring pair in which potentials are changed depending on an addition result only when the addition result obtained by adding two multiplication data output to the second wiring pair to each other is not zero.

16 Claims, 12 Drawing Sheets

| Even Row | Weight | | | |
|---|---|---|---|---|
| | -1 | | +1 | |
| Input | BLi<+> | BLi<-> | BLi<+> | BLi<-> |
| -1 | → H | → H | → H | ↓ L |
| | BLi<+> | BLi<-> | BLi<+> | BLi<-> |
| +1 | → H | ↓ L | → H | → H |

FIG. 3A

| Odd Row | Weight | | | |
|---|---|---|---|---|
| | -1 | | +1 | |
| Input | BLi<+> | BLi<-> | BLi<+> | BLi<-> |
| -1 | → H | → H | ↓ L | → H |
| | BLi<+> | BLi<-> | BLi<+> | BLi<-> |
| +1 | ↓ L | → H | → H | → H |

|  | Multiply | | | |
|---|---|---|---|---|
|  | -1 | | +1 | |
| Even Row | BLi<+> | BLi<-> | BLi<+> | BLi<-> |
|  | → H | ↓ L | → H | → H |
| Odd Row | BLi<+> | BLi<-> | BLi<+> | BLi<-> |
|  | ↓ L | → H | → H | → H |

FIG. 5

| add | | | | | |
|---|---|---|---|---|---|
| -2 | | 0 | | 2 | |
| BLi<+> | BLi<-> | BLi<+> | BLi<-> | BLi<+> | BLi<-> |
| ↓ L | ↓ L | ↓ L | → H | → H | → H |
| | | → H | ↓ L | | |

FIG. 6

Even(H, L), Odd(L, H) → −2
Even(H, L), Odd(H, H) → 0
Even(H, H), Odd(H, H) → 2
Even(H, H), Odd(L, H) → 0

SEMICONDUCTOR STORAGE DEVICE AND INFORMATION PROCESSOR

CROSS REFERENCE TO RELATED APPLICATIONS

This application is based upon and claims the benefit of priority from the prior Japanese Patent Application No. 2020-156657, filed on Sep. 17, 2020, the entire contents of which are incorporated herein by reference.

FIELD

One embodiment of the present disclosure relates to a semiconductor storage device and an information processor.

BACKGROUND

In accordance with the progress of semiconductor process technology, an integration degree of memory cells tends to increase. As the integration degree of the memory cells increases, a power consumption of the semiconductor storage device increases. Therefore, measures to reduce the power consumption are required.

Recently, information processing using machine learning method has been performed in various fields. In the machine learning, for example, learning processing of updating a weight coefficient used in a convolutional neural network (CNN) is performed, but it is necessary to repeat multiple product-sum operation processing for updating the weight coefficient. When the product-sum operation processing can be performed by hardware instead of software, the machine learning can be performed quickly and efficiently.

For example, in order to perform the product-sum operation processing by hardware, it is considered that the weight coefficient is stored in the semiconductor storage device, and the weight coefficient in the semiconductor storage device is updated whenever the product-sum operation processing is performed. However, since the power is consumed whenever reading and writing of the semiconductor storage device is performed, the power consumption increases as the number of the updates of the weight coefficient and the number of weight coefficients to be updated increase.

DETAILED DESCRIPTION

According to one embodiment, a semiconductor storage device has a plurality of memory cells that are arranged in a first direction and store first data, a plurality of first wiring pairs that are provided corresponding to the plurality of memory cells arranged in the first direction, and supply second data multiplied with the first data, a second wiring pair that is provided corresponding to two memory cells adjacent to each other in the first direction, and outputs multiplication data obtained by multiplying the first data stored in the two memory cells with the second data on the first wiring pairs corresponding to the two memory cells, and a third wiring pair in which potentials are changed depending on an addition result only when the addition result obtained by adding two multiplication data output to the second wiring pair to each other is not zero.

Hereinafter, embodiments of a semiconductor storage device and an information processor will be described with reference to drawings. In the following, main constituents of the semiconductor storage device and the information processor will be mainly described, but the semiconductor storage device and the information processor may have constituents and functions not illustrated or described. The following description does not exclude the constituents and the functions not illustrated or described.

Figure 1:
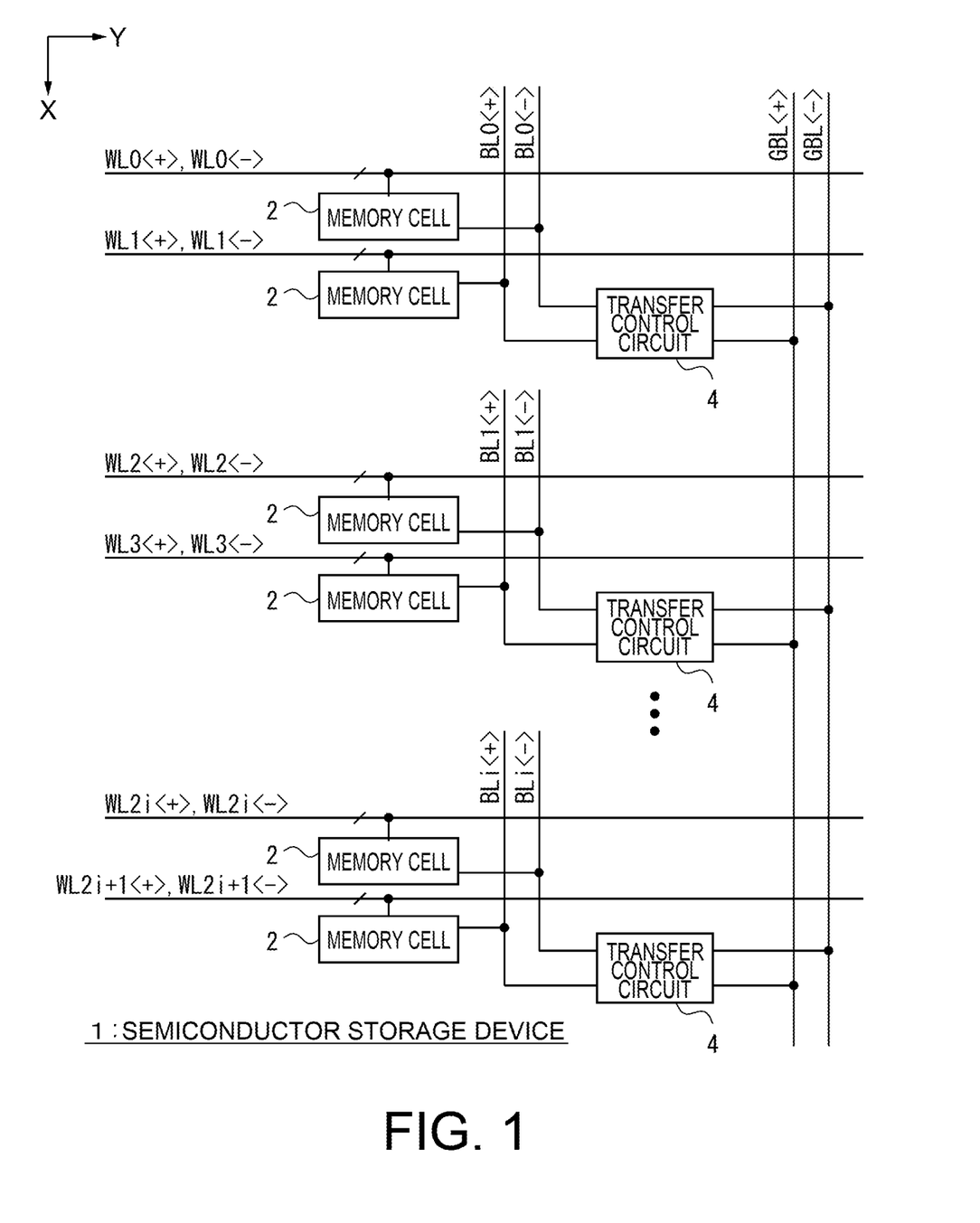
FIG. 1 is a block diagram of a semiconductor storage device according to an embodiment.

FIG. 1 is a block diagram of a semiconductor storage device 1 according to an embodiment. The semiconductor storage device 1 of FIG. 1 can performs a product-sum operation in the semiconductor storage device 1.

The semiconductor storage device 1 of FIG. 1 includes a plurality of memory cells 2, a plurality of word line pairs WLi <+> and WLi <−>, a first bit line pair BLi <+> and BLi <−>, and a second bit line pair GBL <+> and GBL <−>. The first bit line pair BLi <+> and BLi <−> is also called a local bit line pair, and the second bit line pair GBL <+> and GBL <−> is also called a global bit line pair. In the specification, a plurality of word line pairs WLi <+> and WLi <−>, and the first bit line pair BLi <+> and BLi <−> are abbreviated by a subscript i. In the specification, the word line pair is referred to as a first wiring pair, the first bit line pair is referred to as a second wiring pair, the first bit line is referred to as a second wiring, the second bit line pair is referred to as a third wiring pair, and the second bit line is referred to as a third wiring.

A plurality of memory cells 2 are arranged in a first direction X, and each memory cell 2 stores first data. The first direction X is a direction in which the first bit line pair BLi <+> and BLi <−> extends. The first data is, for example, a weight coefficient of a neural network. In the embodiment, the product-sum operation is performed in the semiconductor storage device 1 regardless of the specific operation details of the product-sum operation. Therefore, the first data may be data other than the weight coefficient. In the following, an example in which the first data is the weight coefficient of the neural network will be mainly described.

The memory cell 2 may be a non-volatile memory cell or a volatile memory cell. In a case where a power supply voltage of the semiconductor storage device 1 is turned off, when it is desired to hold the first data used for the product-sum operation, a non-volatile memory cell such as a flash memory may be used. In a case where the first data is re-stored whenever the power supply voltage of the semiconductor storage device 1 is turned on, a volatile memory cell such as a static random access memory (SRAM) cell or a dynamic RAM (DRAM) cell may be used.

A plurality of word line pairs WLi <+> and WLi <−> are provided corresponding to each memory cell 2 arranged in the first direction X. Each word line pair WLi <+> and WLi <−> extends in a second direction Y, which intersects the first direction X. In FIG. 1, only one memory cell 2 is illustrated in the second direction Y intersecting the first direction X, but a plurality of the memory cells 2 may be arranged in the second direction Y. In this case, a plurality of the memory cells 2 arranged in the second direction Y are connected to each word line pair WLi <+> and WLi <−>.

The second data to be multiplied with the first data is supplied to each word line pair WLi <+> and WLi <−>. Both the first data and the second data are binary data. For example, when the first data is "−1" or "1", and the second data is "−1" or "1", the multiplication result obtained by multiplying the first data with the second data is "−1" or "1".

The first bit line pair BLi <+> and BLi <−> is provided corresponding to two memory cells 2 adjacent to each other in the first direction X, and outputs multiplication data obtained by multiplying the first data stored in each of two memory cells 2 with the corresponding second data on the word line pair WLi <+> and WLi <−>.

As illustrated in FIG. 1, when 2×M (M is an integer of 1 or more) memory cells 2 are arranged in the first direction X, one first bit line pair is provided in each of two memory cells 2 adjacent to each other in the first direction X. Therefore, M first bit line pairs BLi <+> and BLi <−> are provided in total.

Only when the addition result obtained by adding two multiplication data output to the first bit line pair BLi <+> and BLi <−> from each of two memory cells 2 to each other is not zero, potentials are changed in the second bit line pair GBL <+> and GBL <−> based on the addition result. That is, only when the first data stored in each of two memory cells 2 is the same as each other, the potentials are changed in the second bit line pair GBL <+> and GBL <−> based on the addition result. For example, when the addition result is "−2" or "2", the potentials of the second bit line pair GBL <+> and GBL <−> are changed, and when the addition result is "0", the potentials of the second bit line pair GBL <+> and GBL <−> are not changed.

In the embodiment, the probability that the addition result obtained by adding the two multiplication data to each other is not zero is set to be one half a combination of all the addition results obtained by adding the two multiplication data to each other. As a result, the probability that the potentials of the second bit line pair GBL <+> and GBL <−> are changed can be set to be one half, and an increase in power consumption due to the change of the potentials can be suppressed. In addition, in the embodiment, only when a result of the product-sum operation is not zero, the potentials of the second bit line pair GBL <+> and GBL <−> are changed. Therefore, when the product-sum operation result having a high appearance frequency of the product-sum operation results is zero, the potentials of the second bit line pair GBL <+> and GBL <−> are not changed, and an effect of reducing the power consumption can be increased.

Figure 2:
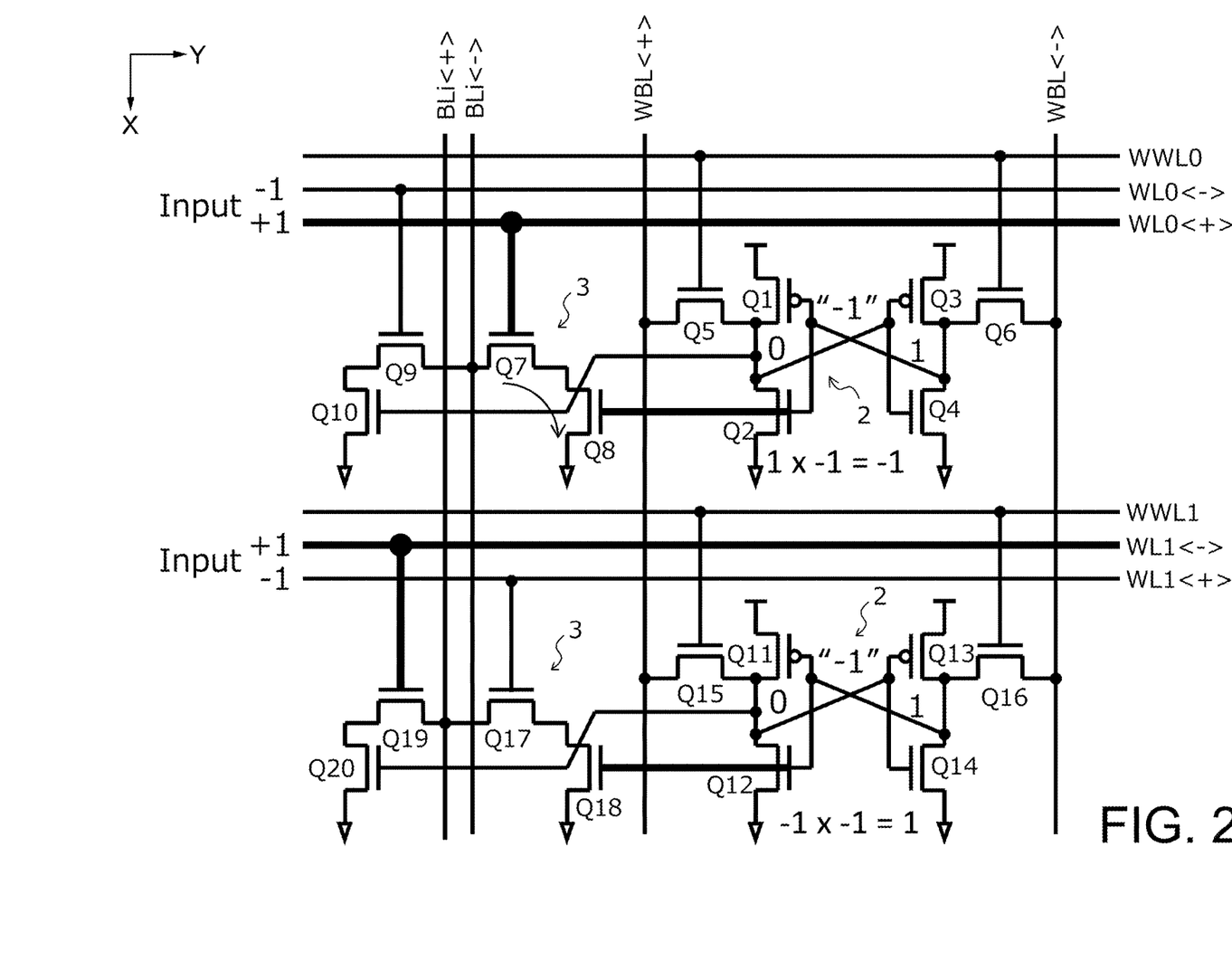
FIG. 2 is a circuit diagram illustrating an example of an internal configuration of the multiplication circuit including a memory cell of FIG. 1, and a first bit line pair.

FIG. 2 is a circuit diagram illustrating an example of an internal configuration of a multiplication circuit 3 including the memory cell 2 of FIG. 1, and the first bit line pair BLi <+> and BLi <−>. The memory cell 2 in FIG. 2 is an SRAM cell. FIG. 2 illustrates two memory cells 2 adjacent to each other in the first direction X. In the following, for convenience, the upper stage side is referred to as an even row, and the memory cell 2 on the upper stage side is referred to as an even cell. The lower stage side is referred to as an odd row, and the memory cell 2 on the lower stage side is referred as an odd cell.

The even cell includes six transistors Q1 to Q6. The transistors Q1 and Q3 are PMOS transistors, and the transistors Q2, and Q4 to Q6 are NMOS transistors. The transistors Q1 and Q2 are cascode-connected between a power supply voltage node and a ground node. Similarly, the transistors Q3 and Q4 are cascode-connected between a power supply voltage node and a ground node. Both gates of the transistors Q1 and Q2 are connected to both drains of the transistors Q3 and Q4, and a source of the transistor Q6. Similarly, both gates of the transistors Q3 and Q4 are connected to both drains of the transistors Q1 and Q2, and a source of the transistor Q5.

Both gates of the transistors Q5 and Q6 are connected to a write word line WWLi (WWL0 in the example of FIG. 2). Both drains of the transistors Q5 and Q6 are connected to a write bit line pair WBL <+> and WBL <−>.

Transistors Q7 to Q10 for multiplying the first data and the second data are provided between the even cell and the first bit line pair BLi <+> and BLi <−>. The transistors Q7 and Q8 are cascode-connected between one first bit line BLi <−> of the first bit line pair BLi <+> and BLi <−> and the ground node. A gate of the transistor Q7 is connected to one word line WLi <+> of the word line pair WLi <+> and WLi <−> (WL0 <+> in the example of FIG. 2). A gate of the transistor Q8 is connected to the gate of the transistor Q2.

The transistors Q9 and Q10 are cascode-connected between the first bit line BLi <−> and the ground node. A gate of the transistor Q9 is connected to the other word line WLi <−> of the word line pair WLi <+> and WLi <−> (WL0 <−> in the example of FIG. 2). A gate of the transistor Q10 is connected to both drains of the transistors Q1 and Q2, and a source of the transistor Q5.

As illustrated in FIG. 2, in the even row, only one first bit line BLi <−> of the first bit line pair BLi <+> and BLi <−> is connected to both drains of the transistors Q7 and Q9, and the other bit line BLi <+> is not connected anywhere.

On the other hand, the odd cell includes six transistors Q11 to Q16, and a connection relationship of each transistor Q11 to Q16 is the same as that of the even cell. In the odd row, transistors Q17 to Q20 are provided. The transistors Q17 and Q18 are cascode-connected between the first bit line BLi <+> and the ground node. A gate of the transistor Q17 is connected to one word line WLi <+> of the word line pair WLi <+> and WLi <−> (WL1<+> in the example of FIG. 2). The transistors Q19 and Q20 are cascode-connected between the first bit line BLi <+> and the ground node. A gate of the transistor Q19 is connected to the other word line WLi <−> of the word line pair WLi <+> and WLi <−> (WL1<−> in the example of FIG. 2).

In this way, both drains of the transistors Q7 and Q9 in the even row are connected to the first bit line BLi <−>, and both drains of the transistors Q17 and Q19 in the odd row are connected to the first bit line BLi <+>. Other than that, the connection relationship is the same for the even row and the odd row.

FIG. 2 illustrates an example in which both the even cell and the odd cell store data of "−1". The data of "−1" is actually stored in each memory cell 2 as an L logic (="0").

In FIG. 2, of the word line pair WLi <+> and WLi <−>, the word line to which input data of "+1" is supplied is illustrated with a thick line. In the Even row, an example is illustrated in which the second data of "+1" is supplied to one word line WLi <+> of the word line pair WLi <+> and WLi <−> (WL0 <+> in the example of FIG. 2). In this case, since the even cell stores the L logic, both the transistors Q2 and Q8 are turned on. Since the data of "+1" is supplied to the word line WLi <+>, the transistor Q7 is turned on. Accordingly, since both the transistors Q7 and Q8 are turned on, the first bit line BLi <−> is discharged, the potential of the first bit line BLi <−> is lowered to the ground level, and the first bit line BLi <−> becomes the L logic. Since the transistors Q7 and Q9 are not connected to the first bit line BLi <+>, the first bit line BLi <+> remains at H level.

In the odd row, input data of "+1" is supplied to the other word line WLi <−> of the word line pair WLi <+> and WLi <−> (WL0 <−> in the example of FIG. 2). Accordingly, the transistor Q19 is turned on, but when the odd cell stores "−1" (L logic="0"), the transistor Q20 is turned off. Since one word line WLi <+> of the word line pair WLi <+> and WLi <−> (WL0 <+> in the example of FIG. 2) is the L logic, the transistor Q17 is turned off. Therefore, the first bit line BLi <+> remains at H level. Since the transistors Q17 and Q19 are not connected to the first bit line BLi <−>, the first bit line BLi <−> also remains at H level. Therefore, in a case where the data of "−1" is stored in the memory cell 2, only when the data of "+1" is supplied to one word line WLi <+> of the word line pair WLi <+> and WLi <−>, any one of the first bit line pair BLi <+> and BLi <−> is discharged. On the other hand, although not illustrated in the drawing, in a case where the data of "+1" is stored in the memory cell 2, only when the data of "+1" is supplied to the other word line WLi <−> of the word line pair WLi <+> and WLi <−>, any one of the first bit line pair BLi <+> and BLi <−> is discharged.

Figure 3A:
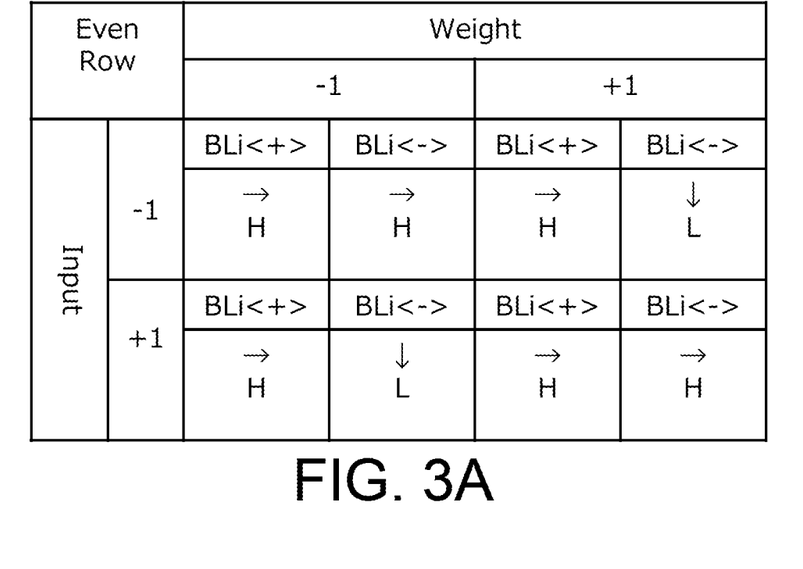
FIG. 3A a table illustrating a logic of a first bit line pair of an even row.

FIG. 3A is a table illustrating a logic of the first bit line pair BLi <+> and BLi <−> of the even row. In FIG. 3A, an example is illustrated in which the first data Weight stored in the even cell is multiplied with the second data Input supplied to the word line pair WLi <+> and WLi <−>, and the multiplication result is output to the first bit line pair BLi <+> and BLi <−>.

Figure 3B:
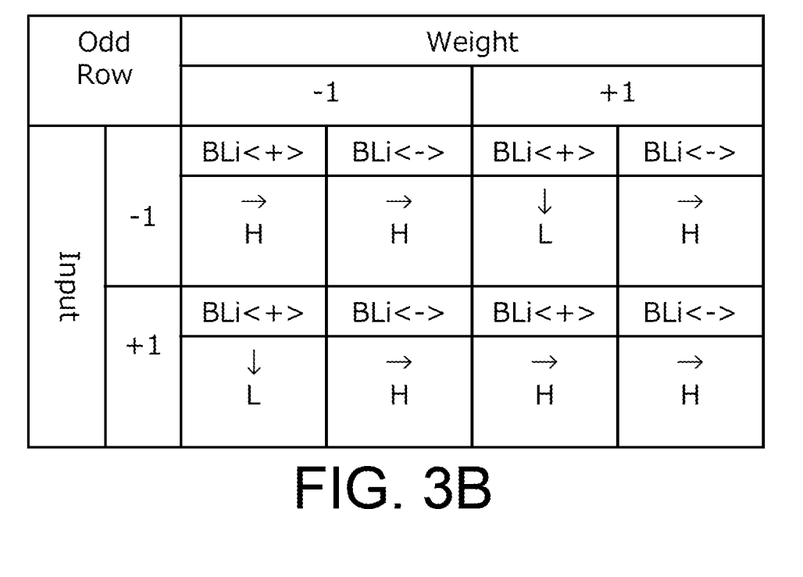
FIG. 3B a table illustrating a logic of a first bit line pair of an odd row.

FIG. 3B a table illustrating a logic of the first bit line pair BLi <+> and BLi <−> of the odd row. In FIG. 3B, an example is illustrated in which the first data Weight stored in the odd cell is multiplied with the second data Input supplied to the word line pair WLi <+> and WLi <−>, and the multiplication result is output to the first bit line pair BLi <+> and BLi <−>.

As can be seen from FIGS. 3A and 3B, in the embodiment, when the first data Weight and the second data Input are the same logics, the logics of the first bit line pair BLi <+> and BLi <−> are (H, H). When the logics of the first data Weight and the second data Input are different from each other, in the even cell, the logics of the first bit line pair BLi <+> and BLi <−> are (H, L), and in the odd cell, the logics of the first bit line pair BLi <+> and BLi <−> are (L, H).

As described above, in the embodiment, only when the multiplication result obtained by multiplying the first data Weight with the second data Input is "−1", the logic of any one of the first bit line pair BLi <+> and BLi <−> is L. In the even cell and the odd cell, the type of the first bit line to be L is reversed.

Figure 4:
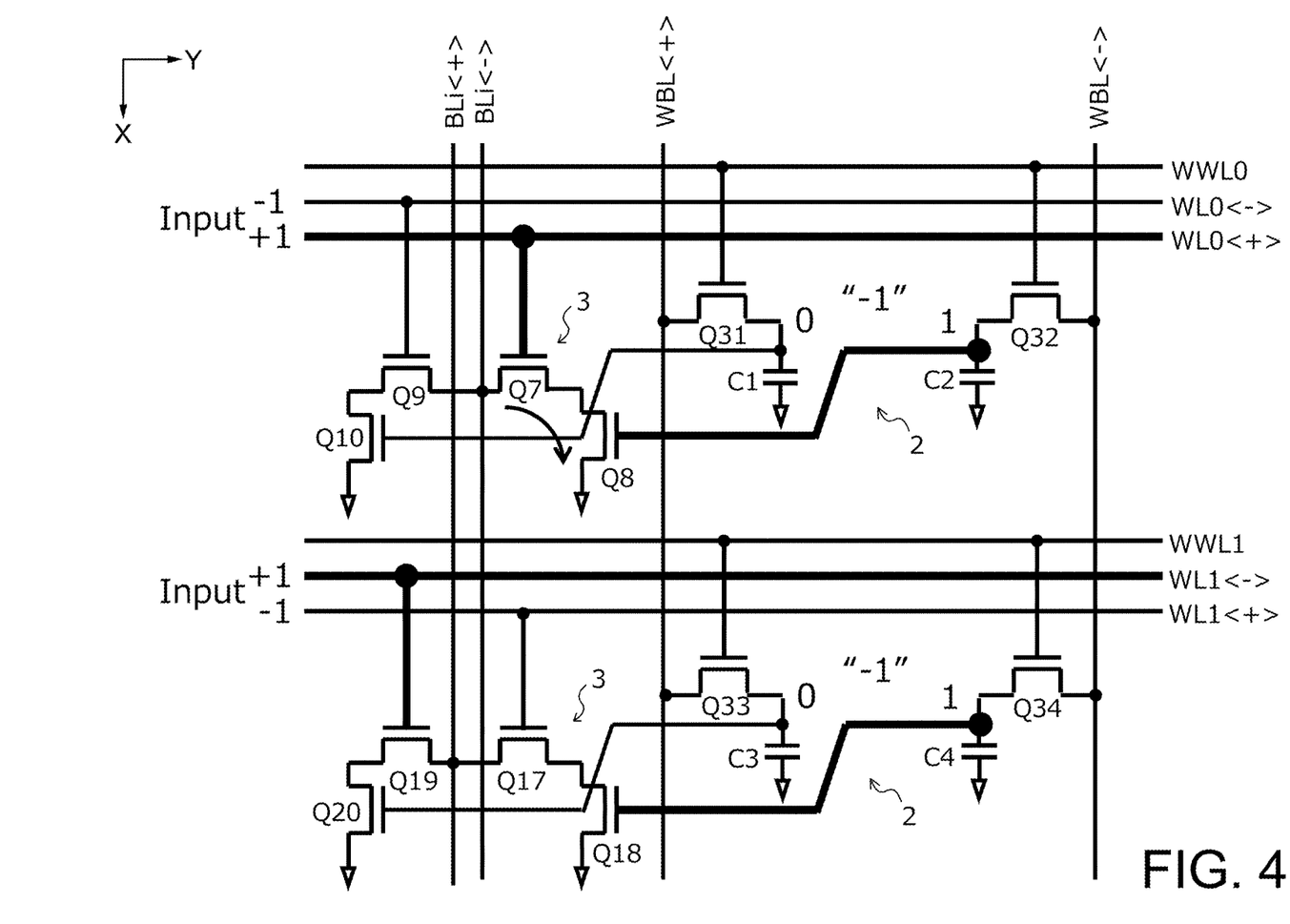
FIG. 4 is a circuit diagram illustrating an internal configuration of a multiplication circuit including a memory cell, the multiplication circuit having a different circuit configuration from that of FIG. 2.

A circuit configuration of the memory cell 2 is not necessarily limited to FIG. 2. FIG. 4 is a circuit diagram illustrating an internal configuration of a multiplication circuit 3 including the memory cell 2, the multiplication circuit having a different circuit configuration from that of FIG. 2. The memory cell 2 in FIG. 4 is a DRAM cell. FIG. 4 illustrates two memory cells 2 configured of an even cell and an odd cell. The configuration of the memory cell 2 and the first bit line pair BLi <+> and BLi <−> is the same as in FIG. 2. The even cell and the odd cell have the same circuit configuration, and the circuit configuration of the even cell will be described below.

The even cell of FIG. 4 includes transistors Q31 and Q32 connected to a write bit line pair WBL <+> and WBL <−>. Gates of the transistors Q31 and Q32 are connected to a write word line WWLi (WWLO in the example of FIG. 4). A capacitor C1 is connected between a source of the transistor Q31 and the ground node, and a capacitor C2 is connected between a source of transistor Q32 and the ground node. The even cell in FIG. 4 stores data in the capacitors C1 and C2, but a periodical refresh operation is required to hold the data for a long period of time.

The multiplication circuit 3 including the memory cell 2 in FIG. 4 multiplies the first data stored in the memory cell 2 with the second data supplied to the word line pair WLi <+> and WLi <−>, and the multiplication result is output to the first bit line pair BLi <+> and BLi <−> as in FIG. 2. The relationship between the logics of the first data and the second data, and the logics of the first bit line pair BLi <+> and BLi <−> is the same as in FIGS. 3A and 3B.

In the embodiment, as illustrated in FIGS. 2 and 4, in a unit of the two memory cells 2 (the even cell and the odd cell) adjacent to each other in the first direction X, the first bit line pair BLi <+> and BLi <−> is provided, and the multiplication result obtained by multiplying the first data in each memory cell 2 with the corresponding second data is output to the first bit line pair BLi <+> and BLi <−>. More specifically, as illustrated in FIGS. 2 and 4, the multiplication result obtained by multiplying the first data in the even cell of the even row with the corresponding second data is output to the first bit line BLi <−>, and the multiplication result obtained by multiplying the first data in the odd cell of the odd row with the corresponding second data is output to the first bit line BLi <+>. In this way, in the even row and the odd row, the two multiplication results are not mixed since the type of the first bit line to which the multiplication result is output is changed. Only when the multiplication result is "−1", the first bit line BLi <+> or BLi <−> is discharged and changed to the L level.

Figure 5:
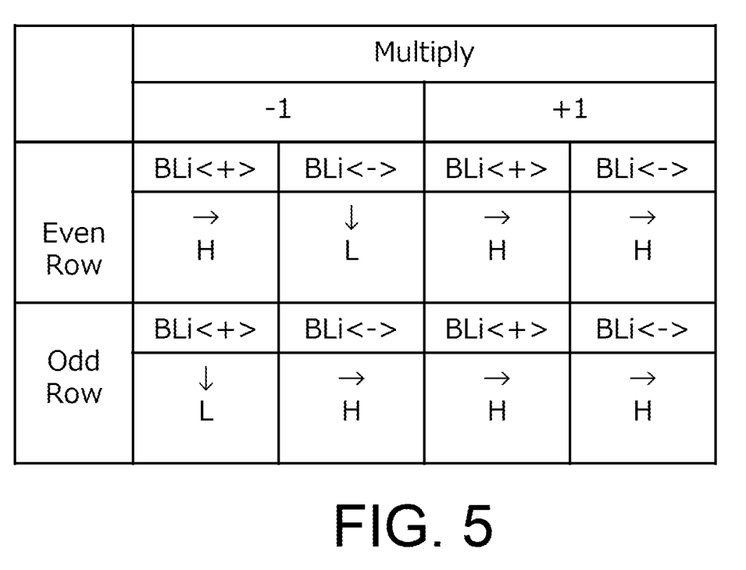
FIG. 5 is a diagram illustrating a relationship between the multiplication result by the multiplication circuit of FIG. 2 and a logic of a first bit line pair.

FIG. 5 is a diagram illustrating a relationship between the multiplication result obtained by the multiplication circuit 3 of FIG. 2 and logics of the first bit line pair BLi <+> and BLi <−>. As illustrated in FIG. 5, when the multiplication result is "−1" (L level), in the even row, the first bit line BLi <+> is at H level and the first bit line BLi <−> is at L level, and in the odd row, the first bit line BLi <+> is at L level and the first bit line BLi <−> is at H level. When the multiplication result is "1" (H level), the first bit line pair BLi <+> and BLi <−> is at H level in both the even row and the odd row. That is, when the multiplication result is "−1" (L level), the first bit line BLi <−> is discharged in the even row, and the first bit line BLi <+> is discharged in the odd row.

In the embodiment, the multiplication results output to each of a plurality of the first bit line pairs BLi <+> and BLi <−> are added to each other to output the result to the second bit line pair GBL <+> and GBL <−>. This addition processing is performed by the transfer control circuit 4 of FIG. 1. The transfer control circuit 4 controls whether or not to change the potentials of the second bit line pair GBL <+> and GBL <−> based on the result obtained by adding two multiplication data output to the first bit line pair BLi <+> and BLi <−> to each other. The transfer control circuit 4 changes any one of the potentials of the second bit line pair GBL <+> and GBL <−> when the logics of the first bit line pair BLi <+> and BLi <−> are the same as each other. The multiplication data obtained by multiplying the first data stored in one memory cell 2 of two memory cells 2 adjacent to each other in the first direction X with the corresponding second data is output to one first bit line of the first bit line pair BLi <+> and BLi <−>. The multiplication data obtained by multiplying the first data stored in the other memory cell 2 of two memory cells 2 adjacent to each other in the first direction X with the corresponding second data is output to the other first bit line of the first bit line pair BLi <+> and BLi <−>.

Figure 6:
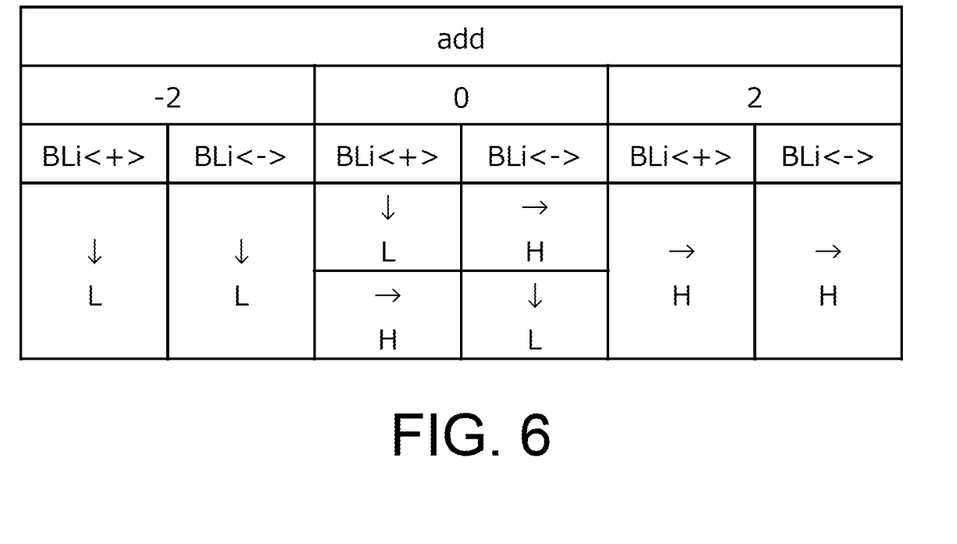
FIG. 6 is a table illustrating a logic of a transfer control circuit.

FIG. 6 is a table illustrating a logic of a transfer control circuit 4. The transfer control circuit 4 adds the multiplication result of the even row and the multiplication result of the odd row, and outputs the addition result to the second bit line pair GBL <+> and GBL <−>. BLi <+> and BLi <−> in FIG. 6 indicates the logics of the first bit line pair BLi <+> and BLi <−> to be added.

Figure 7:
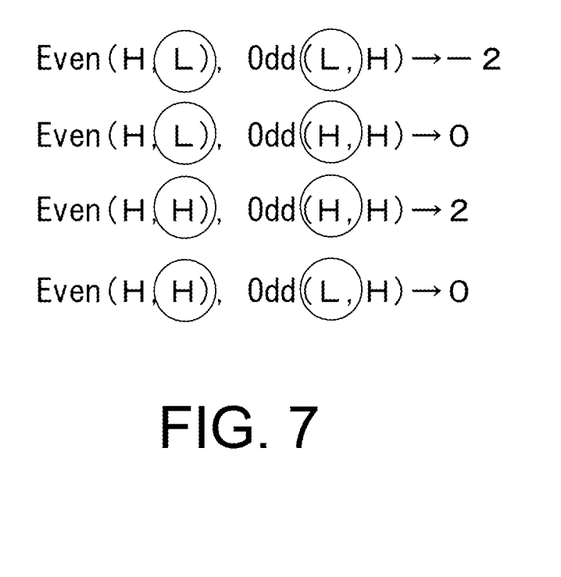
FIG. 7 is a diagram illustrating a correspondence relationship between a logic of a first bit line pair and an addition result of a second bit line.

FIG. 7 is a diagram illustrating a correspondence relationship between the logics of the first bit line pair BLi <+> and BLi <−> and the addition result of the second bit line. The data of logics circled in FIG. 7 are data input to the transfer control circuit 4, and are the logics of the first bit line pair BLi <+> and BLi <−> illustrated in FIG. 6.

As illustrated in FIG. 7, the multiplication result of the even row has two types of Even (H, H) or Even (H, L). The multiplication result of the odd row has two types of Odd (H, H) or Odd (L, H). Therefore, there are four types of combinations when an addition is performed in the even row and the odd row as illustrated in FIG. 7.

In the embodiment, as illustrated in FIG. 1, only BLi <−> indicating the multiplication result is transferred to the transfer control circuit 4 for the even row, and only BLi <+> indicating the multiplication result is transferred to the transfer control circuit 4 for the odd row. Therefore, only the data of logics circled in FIG. 7 is transferred to the transfer control circuit 4, and the addition processing is performed.

As illustrated in FIG. 6, the transfer control circuit 4 sets the addition result to "−2" when BLi <+> and BLi <−> are (L, L), and sets the addition result to "2" when BLi <+> and BLi <−> are (H, H). When the logics of BLi <+> and BLi <−> are different from each other, the addition result is "0".

Figure 8:
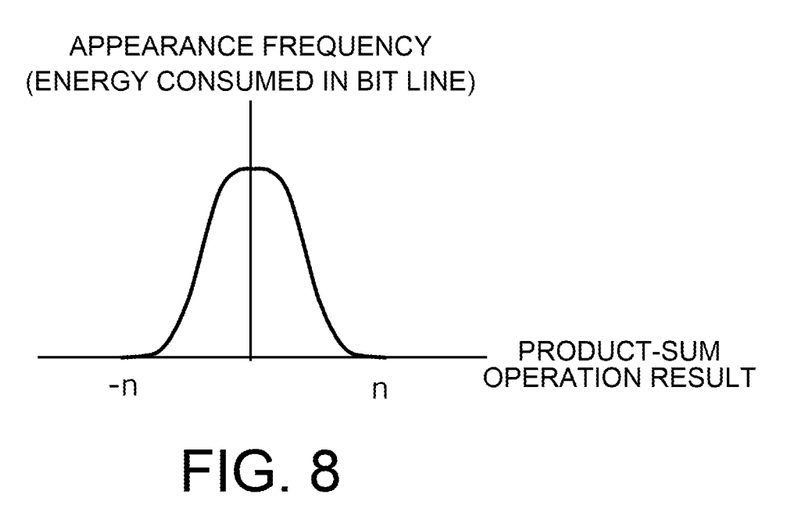
FIG. 8 is a graph illustrating an appearance frequency of a product-sum operation result.

FIG. 8 is a graph illustrating an appearance frequency of a product-sum operation result. As shown in FIG. 8, the appearance frequency when the product-sum operation result becomes zero is the highest, and the appearance frequency tends to decrease as the product-sum operation result becomes larger or smaller. In the embodiment, when the product-sum operation result becomes zero, the potentials of the second bit line pair GBL <+> and GBL <−> are not changed. The multiplication result of the even row and the multiplication result of the odd row can only take "−1" or "1". Therefore, in the embodiment, only when the product-sum operation result becomes "−2" or "2", the potentials of the second bit line pair GBL <+> and GBL <−> are changed.

Figure 9:
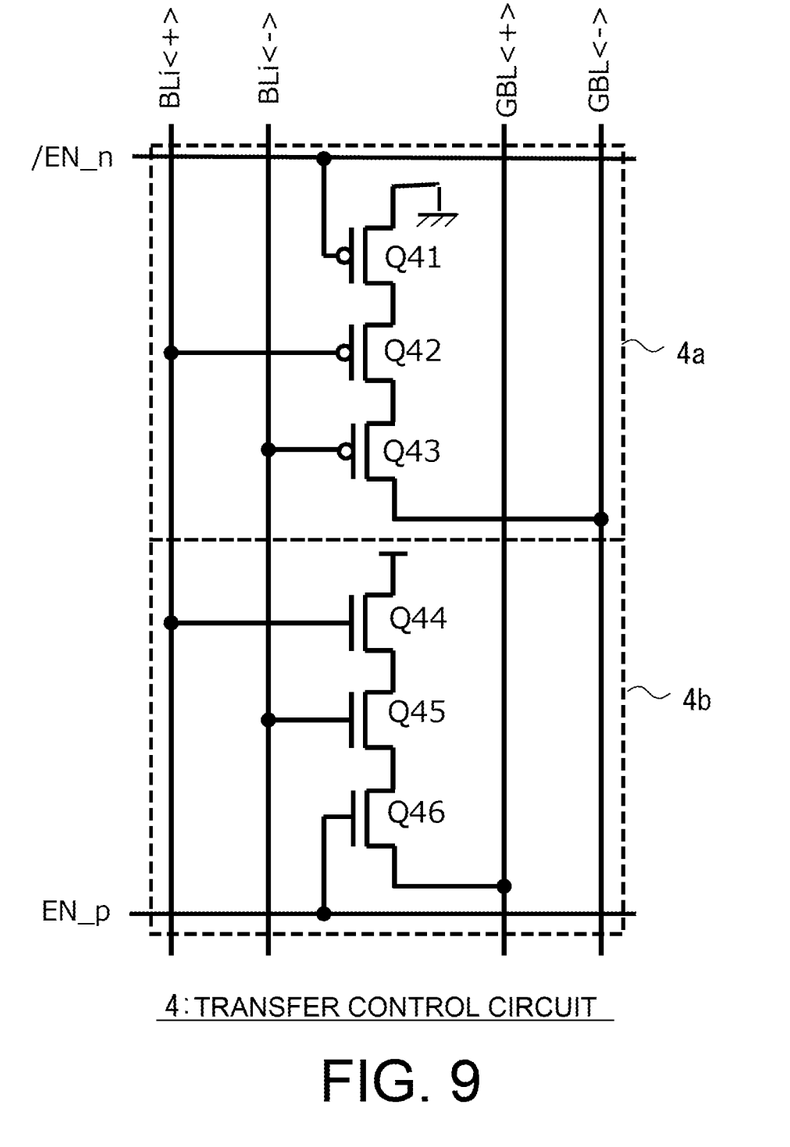
FIG. 9 is a circuit diagram illustrating an example of an internal configuration of a transfer control circuit.

FIG. 9 is a circuit diagram illustrating an example of an internal configuration of the transfer control circuit 4. The transfer control circuit 4 of FIG. 9 includes a first transfer control circuit 4a and a second transfer control circuit 4b. The first transfer control circuit 4a lowers the potential of one second bit line of the second bit line pair GBL <+> and GBL <−> when all the logics of the first bit line pair BLi <+> and BLi <−> are the first logics. The second transfer control circuit 4b raises the potential of the other second bit line of the second bit line pair GBL <+> and GBL <−> when all the logics of the first bit line pair BLi <+> and BLi <−> are the second logics. When the logics of the first bit line pair BLi <+> and BLi <−> are different from each other, the first transfer control circuit 4a and the second transfer control circuit 4b do not change any potentials of the second bit line pair GBL <+> and GBL <−>.

As illustrated in FIG. 9, the first transfer control circuit 4a includes PMOS transistors Q41 to Q43 that are cascode-connected between the second bit line GBL <−> and the ground node. An enable signal /EN_n is input to a gate of the transistor Q41. When the enable signal /EN_n is at L level, the first transfer control circuit 4a controls the potential of the second bit line GBL <−>. The first bit line BLi <+> is connected to a gate of the transistor Q42, and the first bit line BLi <−> is connected to a gate of the transistor Q43.

The second transfer control circuit 4b includes NMOS transistors Q44 to Q46 cascode-connected between a power supply voltage node and the second bit line GBL <+>. An enable signal EN_p is input to a gate of the transistor Q46. When the enable signal EN_p is H logic, the second transfer control circuit 4b controls the potential of the second bit line GBL <+>. The first bit line BLi <−> is connected to a gate of the transistor Q45, and the first bit line BLi <+> is connected to a gate of the transistor Q44.

When the first bit line pair BLi <+> and BLi <−> circled in FIG. 7 is (L, L), all the transistors Q41 to Q43 in the first transfer control circuit 4a are turned on, and the second bit line GBL <−> is discharged to lower the potential. When the first bit line pair BLi <+> and BLi <−> circled in FIG. 7 is (H, H), all the transistors Q44 to Q46 in the second transfer control circuit 4b are turned on, and the potential of the second bit line GBL <+> is raised.

In FIG. 9, an example is illustrated in which when the first bit line pair BLi <+> and BLi <−> is (L, L), the potential of the second bit line GLB <−> is lowered, and when the first bit line pair BLi <+>, BLi <−> is (H, H), the potential of the second bit line GLB <+> is raised, but a direction in which the potentials of the second bit line pair GLB <+> and GLB <−> is changed may be reversed. In this case, the first transfer control circuit 4a may be connected to the power supply voltage node, and the second transfer control circuit 4b may be connected to the ground node.

Each of the first transfer control circuit 4a and the second transfer control circuit 4b may be connected to the power supply voltage node. In this case, when the first bit line pair BLi <+> and BLi <−> is (L, L), the potential of the second bit line GBL <−> is raised. When the first bit line pair BLi <+> and BLi <−> is (H, H), the potential of the second bit line GBL <+> is raised. Each of the first transfer control circuit 4a and the second transfer control circuit 4b may be connected to the ground node. In this case, when the first bit line pair BLi <+> and BLi <−> is (L, L), the potential of the second bit line GBL <−> is lowered. When the first bit line pair BLi <+> and BLi <−> is (H, H), the potential of the second bit line GBL <+> is lowered.

Figure 10:
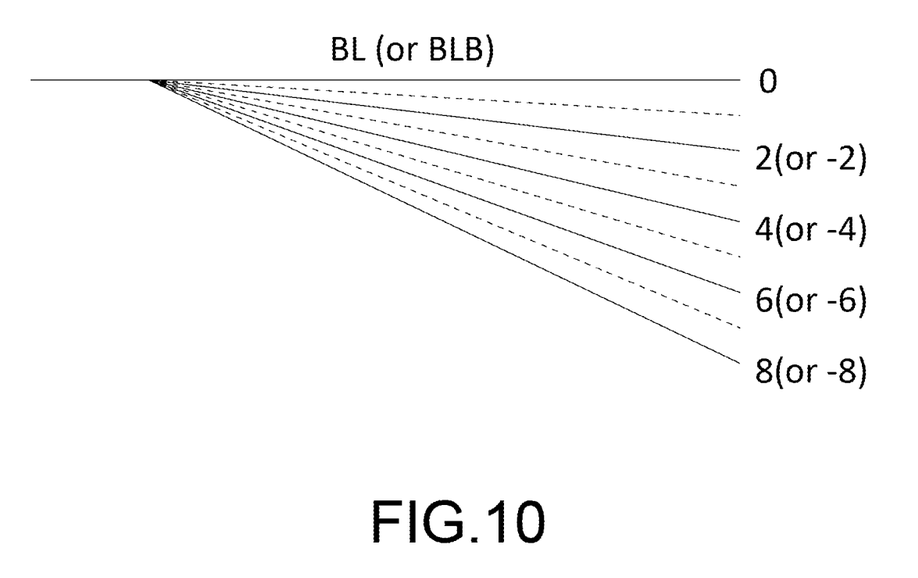
FIG. 10 is a view schematically illustrating a potential change of a second bit line pair.

FIG. 10 is a view schematically illustrating a potential change of the second bit line pair GBL <+> and GBL <−>. In the embodiment, when the addition result obtained by adding the first bit line pair BLi <+> and BLi <−> to each other is "−2" or "2", the potential of the second bit line is changed. A change width of the potential of the second bit line is minimized when the addition result obtained by adding the first bit lines to each other is "+1" or "−1", and the potential of the second bit line when the potential of the second bit line is changed in a unit of the minimum change width is the same as that in FIG. 11.

Figure 11:
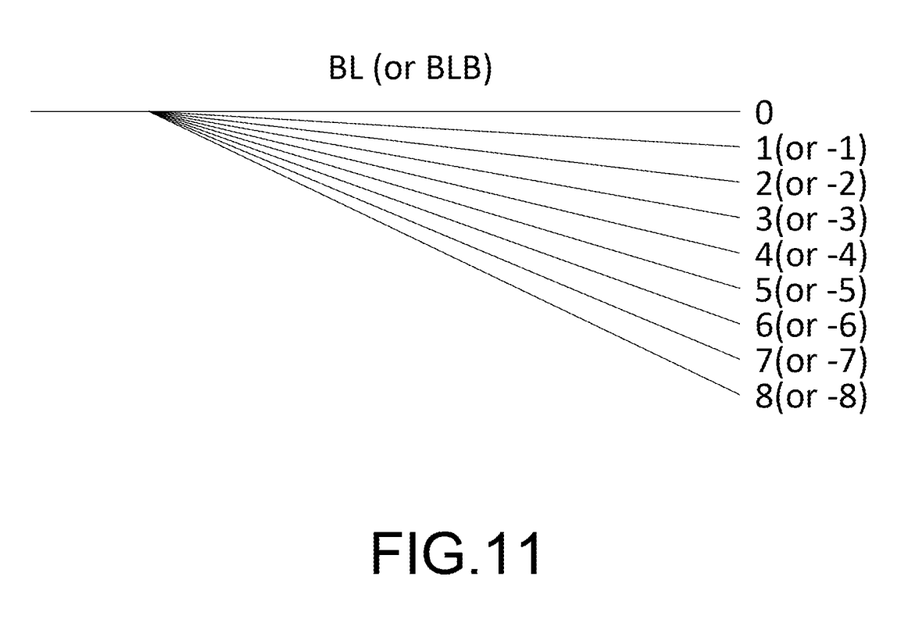
FIG. 11 is a view illustrating a potential change of a second bit line a unit of a minimum change width.

As can be seen by comparing FIG. 10 with FIG. 11, in the embodiment, the potential of the second bit line is changed in a unit twice the minimum change width. Therefore, according to the embodiment, the potential of the second bit line is changed in a unit twice the minimum change width. As a result, a read margin of the second bit line pair GBL <+> and GBL <−> can be extended, and data reading can be performed stably.

In the embodiment, the potentials of the second bit line pair GBL <+> and GBL <−> can be arbitrarily changed in a unit twice the minimum change width depending on the result of the product-sum operation. In FIG. 10, for convenience, an example is illustrated in which the minimum change width of the potential is set to "1", and the potentials of the second bit line pair GBL <+> and GBL <−> are changed in a unit twice the minimum change width. As shown in FIG. 10, the potentials of the second bit line pair GBL <+> and GBL <−> is changed in a positive or negative direction in a unit twice the minimum change width depending on the result of the product-sum operation.

Figure 12:
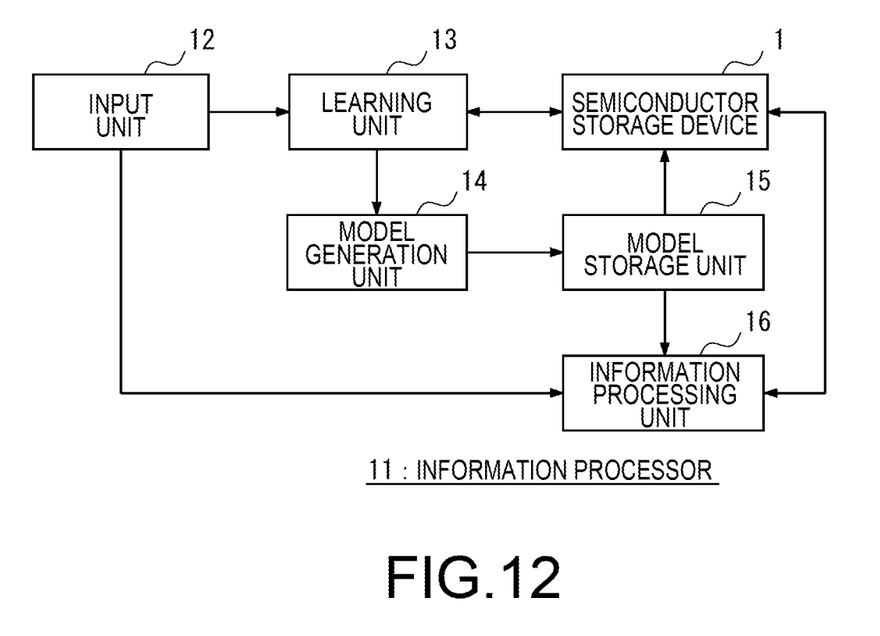
FIG. 12 is a block diagram illustrating an example of an information processor.

The semiconductor storage device 1 according to the embodiment can be applied to an information processor that generates a calculation model and performs arbitrary information processing. FIG. 12 is a block diagram illustrating an example of the information processor 11. The information processor 11 of FIG. 12 includes an input unit 12, a learning unit 13, the semiconductor storage device 1 according to the embodiment, a model generation unit 14, a model storage unit 15, and an information processing unit 16.

The input unit 12 inputs various information necessary for generating a calculation model. The learning unit 13 performs processing of updating a weight coefficient of a neural network used in the calculation model. The information processor 11 of FIG. 12 performs a product-sum operation of the input data and the weight coefficient of the neural network in the semiconductor storage device 1. The learning unit 13 acquires the product-sum operation result output to the second bit line pair GBL <+> and GBL <−> of the semiconductor storage device 1, and performs a learning processing of updating the weight coefficient. The semiconductor storage device 1 may be provided inside the learning unit 13.

The model generation unit 14 generates a calculation model to which the learning result of the learning unit 13 is applied. The calculation model includes a neural network including an updated weight coefficient. By giving the input data to the calculation model, output data to which the learning result is applied can be obtained. The model storage unit 15 stores the calculation model generated by the model generation unit 14.

The information processing unit 16 inputs the data input from the input unit 12 to the learned calculation model stored in the model storage unit 15, and performs product-sum operation processing in the neural network to acquire the result obtained by performing predetermined information processing. At this time, the information processing unit 16 can quickly perform the product-sum operation processing by performing the product-sum operation processing in the semiconductor storage device 1.

FIG. 12 is an example of the information processor 11, and the semiconductor storage device 1 according to the present embodiment is not necessarily specialized in the product-sum operation of the weight coefficient and the input data of the neural network, and can be used for various product-sum operations.

As described above, in the embodiment, the first data, which can be, for example, a weight coefficient, is stored in the memory cell 2, the second data is supplied to the word line pair WLi <+> and WLi <−>, and the first data is multiplied with the second data in the semiconductor storage device 1, thereby outputting the multiplication data to the first bit line pair BLi <+> and BLi <−>.

By providing the first bit line pair BLi <+> and BLi <−> in a unit of two memory cells 2 adjacent to each other in the first direction X, the result obtained by adding two multiplication data in the two memory cells 2 to each other can be output to the second bit line pair GBL <+> and GBL <−>. By connecting a plurality of the first bit line pairs BLi <+> and BLi <−> to the second bit line pair GBL <+> and GBL <−>, a plurality of the product-sum operation results can be output to the second bit line pair GBL <+> and GBL <−>, and the product-sum operation can be performed in the semiconductor storage device 1.

Further, in the embodiment, only when the addition result obtained by adding the two multiplication data to each other is not zero, the potentials of the second bit line pair GBL <+> and GBL <−> are changed. Therefore, power consumption when the product-sum operation is performed in the semiconductor storage device 1 can be reduced.

In the embodiment, in order to increase the potential change width in which the potentials of the second bit line pair GBL <+> and GBL <−> are changed, a read margin when the data of the second bit line pair GBL <+> and GBL <−> are read can be increased, and a frequency of a read error can be reduced.

Further, in the embodiment, since the potentials of the second bit line pair GBL <+> and GBL <−> can be arbitrarily changed in a unit of the potential change width in the positive direction and the negative direction depending on the product-sum operation result, the product-sum operation result can be correctly generated even when the product-sum operation result becomes a large value in the positive direction or the negative direction.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor storage device comprising:
a plurality of memory cells that are arranged in a first direction and store first data;
a plurality of first wiring pairs that are provided corresponding to the plurality of memory cells arranged in the first direction, and supply second data multiplied with the first data;
a second wiring pair that is provided corresponding to two memory cells adjacent to each other in the first direction, to which multiplication data are output from the two memory cells, the multiplication data being obtained by multiplying the first data stored in the two memory cells with the second data on the first wiring pairs corresponding to the two memory cells; and
a third wiring pair in which potentials are changed depending on an addition result only when the addition result obtained by adding two multiplication data output to the second wiring pair to each other is not zero, wherein in the third wiring pair, potentials are changed depending on the addition result only when the two multiplication data is identical to each other.

2. The semiconductor storage device according to claim 1, wherein
a probability that the addition result obtained by adding the two multiplication data to each other is not zero is one half a combination of all the addition results obtained by adding the two multiplication data to each other.

3. The semiconductor storage device according to claim 1, wherein
in one third wiring of the third wiring pair, a potential is raised or lowered by a predetermined potential change width only when the addition result obtained by adding the two multiplication data to each other is not zero.

4. The semiconductor storage device according to claim 3, wherein
the predetermined potential change width is twice a minimum potential change width of the third wiring depending on a minimum change value of a product-sum operation.

5. The semiconductor storage device according to claim 3, wherein
in one third wiring of the third wiring pair, a potential is raised or lowered by the predetermined potential change width when the multiplication data is updated and the addition result obtained by adding the two multiplication data to each other is not zero.

6. The semiconductor storage device according to claim 1, wherein
one second wiring of the second wiring pair is set to a logic depending on multiplication data obtained by multiplying the first data stored in one memory cell of the two memory cells adjacent to each other, and the second data on the first wiring pair corresponding to the one memory cell, and
the other second wiring of the second wiring pair is set to a logic depending on multiplication data obtained by multiplying the first data stored in the other memory cell of the two memory cells adjacent to each other, and the second data on the first wiring pair corresponding to the other memory cell.

7. A semiconductor storage device comprising:
a plurality of memory cells that are arranged in a first direction and store first data;
a plurality of first wiring pairs that are provided corresponding to the plurality of memory cells arranged in the first direction, and supply second data multiplied with the first data;
a second wiring pair that is provided corresponding to two memory cells adjacent to each other in the first direction, to which multiplication data are output from the two memory cells, the multiplication data being obtained by multiplying the first data stored in the two memory cells with the second data on the first wiring pairs corresponding to the two memory cells; and
a third wiring pair in which potentials are changed depending on an addition result only when the addition result obtained by adding two multiplication data output to the second wiring pair to each other is not zero, wherein
one second wiring of the second wiring pair is set to a logic depending on multiplication data obtained by multiplying the first data stored in one memory cell of the two memory cells adjacent to each other, and the second data on the first wiring pair corresponding to the one memory cell,
the other second wiring of the second wiring pair is set to a logic depending on multiplication data obtained by multiplying the first data stored in the other memory cell of the two memory cells adjacent to each other, and the second data on the first wiring pair corresponding to the other memory cell,
the one second wiring of the second wiring pair is discharged, and a potential of the one second wiring is lowered when multiplication data obtained by multiplying the first data stored in the one memory cell of the two memory cells adjacent to each other, and the second data on the first wiring pair corresponding to the one memory cell is a predetermined logic, and
the other second wiring of the second wiring pair is discharged, and a potential of the other second wiring is lowered when multiplication data obtained by multiplying the first data stored in the other memory cell of the two memory cells adjacent to each other, and the second data on the first wiring pair corresponding to the other memory cell is a predetermined logic.

8. The semiconductor storage device according to claim 7, wherein
the multiplication data becomes the predetermined logic when logics of the first data and the second data to be multiplied, are different from each other.

9. The semiconductor storage device according to claim 1, wherein
the second wiring pair is provided for the two memory cells adjacent to each other in the first direction.

10. The semiconductor storage device according to claim 1, further comprising
a transfer control circuit that controls whether or not to change potentials of the third wiring pair based on a value obtained by adding the two multiplication data output to the second wiring pair to each other.

11. The semiconductor storage device according to claim 10, wherein
the second wiring pair is connected to the transfer control circuit,
a high-order bit of multiplication data obtained by multiplying the first data stored in one memory cell of the two memory cells adjacent to each other in the first direction with the corresponding second data is output to one second wiring of the second wiring pair,
a low-order bit of multiplication data obtained by multiplying the first data stored in the other memory cell of the two memory cells adjacent to each other in the first direction with the corresponding second data is output to the other second wiring of the second wiring pair, and
the transfer control circuit changes a potential of any one of the third wiring pair when logics of the second wiring pair are identical to each other.

12. The semiconductor storage device according to claim 11, wherein the transfer control circuit comprises
a first transfer control circuit that lowers a potential of one third wiring of the third wiring pair when both logics of the second wiring pair are first logics, and
a second transfer control circuit that raises a potential of the other third wiring of the third wiring pair when both logics of the second wiring pair are second logics.

13. The semiconductor storage device according to claim 1, wherein the first data is a weight coefficient of a neural network,
the second data is input data of the neural network,
the second wiring pair transmits multiplication data obtained by multiplying the first data and the second data, and
the third wiring pair transmits product sum data obtained by adding the multiplication data to one another, the multiplication data being transferred through a plurality of the second wiring pairs.

14. The semiconductor storage device according to claim 1, wherein
the third wiring pair is arranged corresponding to the plurality of memory cells arranged in the first direction.

15. A semiconductor storage device comprising:
a plurality of memory cells that are arranged in a first direction and store first data;
a plurality of first wiring pairs that are provided corresponding to the plurality of memory cells arranged in the first direction, and supply second data multiplied with the first data;
a second wiring pair that is provided corresponding to two memory cells adjacent to each other in the first direction, to which multiplication data are output from the two memory cells, the multiplication data being obtained by multiplying the first data stored in the two memory cells with the second data on the first wiring pairs corresponding to the two memory cells; and
a third wiring pair in which potentials are changed depending on an addition result only when the addition result obtained by adding two multiplication data output to the second wiring pair to each other is not zero, wherein
the first wiring pair is a word line pair,
the second wiring pair is a first bit line pair, and
the third wiring pair is a second bit line pair.

16. An information processor comprising:
a learning unit configured to perform learning processing of updating a weight coefficient of a neural network by using input data and output data for learning;
a semiconductor storage device configured to perform a product-sum operation that adds multiplication data to each other according to a network configuration of the neural network, the multiplication data obtained by multiplying the input data with the weight coefficient;
a calculation model generator configured to generate a calculation model including the neural network in which the learning unit performs the learning processing; and
an information processor configured to give the input data to the calculation model, and perform a predetermined information processing based on a result obtained by performing a product-sum operation in the neural network of the calculation model, wherein
the semiconductor storage device comprises:
a plurality of memory cells that are arranged in a first direction, and store the weight coefficient;
a plurality of first wiring pairs that are provided corresponding to the plurality of the memory cells arranged in the first direction, and supply the input data multiplied with the weight coefficient;
a second wiring pair that is provided corresponding to the two memory cells adjacent to each other in the first direction, to which multiplication data are output from the two memory cells, the multiplication data being obtained by multiplying the weight coefficient stored in the two memory cells with the input data on the first wiring pairs corresponding to the two memory cells; and
a third wiring pair in which potentials are changed depending on an addition result only when the addition result obtained by adding the two multiplication data output to the second wiring pair from each of the two memory cells to each other is not zero, and
a result of the product-sum operation is output from the third wiring pair, wherein
in the third wiring pair, potentials are changed depending on the addition result only when the two multiplication data is identical to each other.

* * * * *